United States Patent
Lo et al.

(10) Patent No.: US 11,177,230 B2
(45) Date of Patent: Nov. 16, 2021

(54) ELECTRONIC DEVICE INCLUDING AT LEAST ONE ROW OF BUMPS

(71) Applicant: NOVATEK Microelectronics Corp., Hsinchu (TW)

(72) Inventors: Hsien-Wen Lo, Hsinchu County (TW); Chang-Sheng Tseng, Taoyuan (TW)

(73) Assignee: NOVATEK Microelectronics Corp., Hsinchu (TW)

(*) Notice: Subject to any disclaimer, the term of this patent is extended or adjusted under 35 U.S.C. 154(b) by 2 days.

(21) Appl. No.: 16/737,883

(22) Filed: Jan. 8, 2020

(65) Prior Publication Data
US 2021/0210451 A1    Jul. 8, 2021

(51) Int. Cl.
*H01L 23/00* (2006.01)
*H01L 27/32* (2006.01)

(52) U.S. Cl.
CPC .......... *H01L 24/14* (2013.01); *H01L 27/3276* (2013.01); *H01L 2224/14131* (2013.01)

(58) Field of Classification Search
CPC ........... H01L 24/14; H01L 2224/14131; H01L 25/18; H01L 24/16; H01L 24/32; H01L 24/73; H01L 27/3276; H01L 24/17; H01L 24/81
USPC ......................................... 257/737; 438/613
See application file for complete search history.

(56) References Cited

U.S. PATENT DOCUMENTS

| | | | |
|---|---|---|---|
| 9,591,754 B2 | 3/2017 | Lee | |
| 9,894,792 B2 | 2/2018 | Bae et al. | |
| 9,917,113 B2 | 3/2018 | Lee | |
| 2014/0321088 A1* | 10/2014 | Bae | H05K 7/06 361/767 |
| 2015/0366049 A1* | 12/2015 | Lee | H01L 24/81 361/749 |
| 2018/0040576 A1* | 2/2018 | Kim | H01L 51/0097 |
| 2018/0047314 A1* | 2/2018 | Chen | H01L 21/77 |
| 2019/0326274 A1* | 10/2019 | Lee | H01L 24/17 |
| 2019/0348485 A1* | 11/2019 | Jo | H01L 27/323 |

FOREIGN PATENT DOCUMENTS

KR    1020150022211 A    3/2015

\* cited by examiner

*Primary Examiner* — Didarul A Mazumder
(74) *Attorney, Agent, or Firm* — CKC & Partners Co., LLC

(57) ABSTRACT

An electronic device includes a substrate and first bumps. The first bumps are disposed on the substrate and arranged in a first bump row. Each first bump has a first end and a second end opposite to each other. Centers of the first ends of the first bumps are on a first axial line. A first axial coordinate of a center of the second end of a respective first bump relative to a second axial line perpendicular to the first axial line is $X_A(1+\beta_A Y_A)$, in which $X_A$ is a first axial coordinate of the center of the first end of the respective first bump relative to the second axial line, $Y_A$ is a second axial coordinate of the center of the second end of the respective first bump relative to the first axial line, and $\beta_A$ is a slope coefficient of the respective first bump.

19 Claims, 6 Drawing Sheets

ELECTRONIC DEVICE INCLUDING AT LEAST ONE ROW OF BUMPS

BACKGROUND

Technical Field

The present disclosure relates to an electronic device, and more particularly, to an electronic device including bumps for electrical connection.

Description of Related Art

An electronic device, such as a liquid crystal display (LCD) device or an organic light-emitting diode (OLED) device, may include an array substrate, which has a display area and a non-display area surrounding the display area. The array substrate may be used as a circuit board for separately driving pixels of the electronic device. Gate wiring for transmitting a scan signal, data wiring for transmitting an image signal, thin-film transistors (TFTs), and various organic or inorganic insulating layers may be provided on the array substrate. Each of the TFTs include a gate electrode that forms part of the gate wiring, a semiconductor layer that forms a channel with the gate electrode, and a source electrode and a drain electrode that form parts of the data wiring. The TFT may function as a switching device.

In the non-display area, which surrounds the display area, wires may be provided. The wires may be connected to gate lines or data lines in the display area. The wires may extend in various shapes, and may also be connected to pads in a pad unit below the array substrate. In the pad unit, a driving integrated circuit may be provided. The driving integrated circuit may apply driving signals to the gate lines and the data lines. The driving integrated circuit may include a plurality of bumps, which are aligned with, and provide driving signals to, the pads, respectively, of the pad unit.

The array substrate may be formed of a flexible material, such as polyimide, in accordance with recent trends in manufacturing flexible displays. However, the size of a flexible array substrate may change during processes, which are then followed by the formation of a pad unit, thereby causing misalignment between the bumps of a driving integrated circuit and the pads of the pad unit.

Accordingly, it is an important issue for the industry to provide an electronic device capable of solving the aforementioned problems.

SUMMARY

An aspect of the disclosure is to provide an electronic device that can efficiently solve the aforementioned problems.

According to an embodiment of the disclosure, an electronic device includes a substrate and a plurality of first bumps. The first bumps are disposed on the substrate and arranged in a first bump row. Each of the first bumps has a first end and a second end opposite to each other. Centers of the first ends of the first bumps are on a first axial line. For each of the first bumps, a first axial coordinate of a center of the second end of a respective one of the first bumps relative to a second axial line perpendicular to the first axial line is $X_A(1+\beta_A Y_A)$, in which $X_A$ is a first axial coordinate of the center of the first end of said respective one of the first bumps relative to the second axial line, $Y_A$ is a second axial coordinate of the center of the second end of said respective one of the first bumps relative to the first axial line, and $\beta_A$ is a slope coefficient of said respective one of the first bumps.

In an embodiment of the disclosure, the slope coefficient of one of the first bumps is identical to the slope coefficient of another of the first bumps.

In an embodiment of the disclosure, the slope coefficient of one of the first bumps is different from the slope coefficient of another of the first bumps.

In an embodiment of the disclosure, the slope coefficient of said one of the first bumps is smaller than the slope coefficient of said another of the first bumps, and said one of the first bumps is closer to the second axial line than said another of the first bumps.

In an embodiment of the disclosure, the slope coefficients decrease as the first bumps get closer to the second axial line.

In an embodiment of the disclosure, the farther the first bumps are from the second axial line, the more the first bumps tilt relative to the second axial line.

In an embodiment of the disclosure, the centers of the first ends of the first bumps are arranged equidistantly or not arranged equidistantly.

In an embodiment of the disclosure, the second axial line is centered at adjacent two of the first bumps.

In an embodiment of the disclosure, the second axial line passes through the first end and the second end of one of the first bumps.

In an embodiment of the disclosure, the first bumps are symmetric relative to the second axial line.

In an embodiment of the disclosure, the electronic device further includes a plurality of second bumps disposed on the substrate and arranged in a second bump row. At least a part of the second bumps are respectively aligned with the first bumps to respectively form a plurality of bump columns.

In an embodiment of the disclosure, each of the second bumps has a first end and a second end opposite to each other. A first axial coordinate of a center of the first end of the second bump in a respective one of the bump columns relative to the second axial line is $X_B(1-\beta_B Y_B)$, in which $X_B$ is a first axial coordinate of the center of the first end of the first bump in said respective one of the bump columns relative to the second axial line, $Y_B$ is a second axial coordinate of the center of the first end of the second bump in said respective one of the bump columns relative to the first axial line, and $\beta_B$ is a slope coefficient of the first bump in said respective one of the bump columns.

In an embodiment of the disclosure, a first axial coordinate of a center of the second end of the second bump in said respective one of the bump columns relative to the second axial line is $X_B(1+\beta_C Y_C)$, in which $Y_C$ is a second axial coordinate of the center of the second end of the second bump in said respective one of the bump columns relative to the first axial line, and $\beta_C$ is a slope coefficient of the second bump in said respective one of the bump columns.

In an embodiment of the disclosure, the slope coefficients of the first bump and the second bump in said respective one of the bump columns are the same.

In an embodiment of the disclosure, the slope coefficients of the first bump and the second bump in said respective one of the bump columns are different.

In an embodiment of the disclosure, each of the second bumps has a first end and a second end opposite to each other. A first axial coordinate of a center of the first end of the second bump in said respective one of the bump columns relative to the second axial line is $(X_B+S)(1+\beta_B Y_B)$, in which $X_B$ is a first axial coordinate of the center of the first end of the first bump in said respective one of the bump columns relative to the second axial line, $Y_B$ is a second axial coordinate of the center of the first end of the second bump in said respective one of the bump columns relative to the first axial line, and $β_B$ and S are respectively a slope coefficient and a shift value of the second bump in said respective one of the bump columns.

In an embodiment of the disclosure, the shift value of the second bump in one of the bump columns is different from the shift value of the second bump in another of the bump columns.

In an embodiment of the disclosure, a number of the first bumps and a number of the second bumps are different.

In an embodiment of the disclosure, two of the second bumps other than the bump columns are arranged at opposite ends of the second bump row.

In an embodiment of the disclosure, the second bumps are symmetric relative to the second axial line.

Accordingly, in the electronic device of the present disclosure, the degrees of tilt of the bumps are varied based on the first ends of the bumps relative to a reference line (i.e., the second axial line). As such, when a mismatch occurs between the bumps of two electronic devices to be bonded, the bumps may flexibly respond to the deformation of the substrate of one of the electronic devices. Specifically, in response to the substrate expanding, the bumps of another of the electronic devices may be aligned with the bumps on the deformed substrate as a result of expansion by moving said another of the electronic devices along the reference line by a distance. As a result, bonding reliability may be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
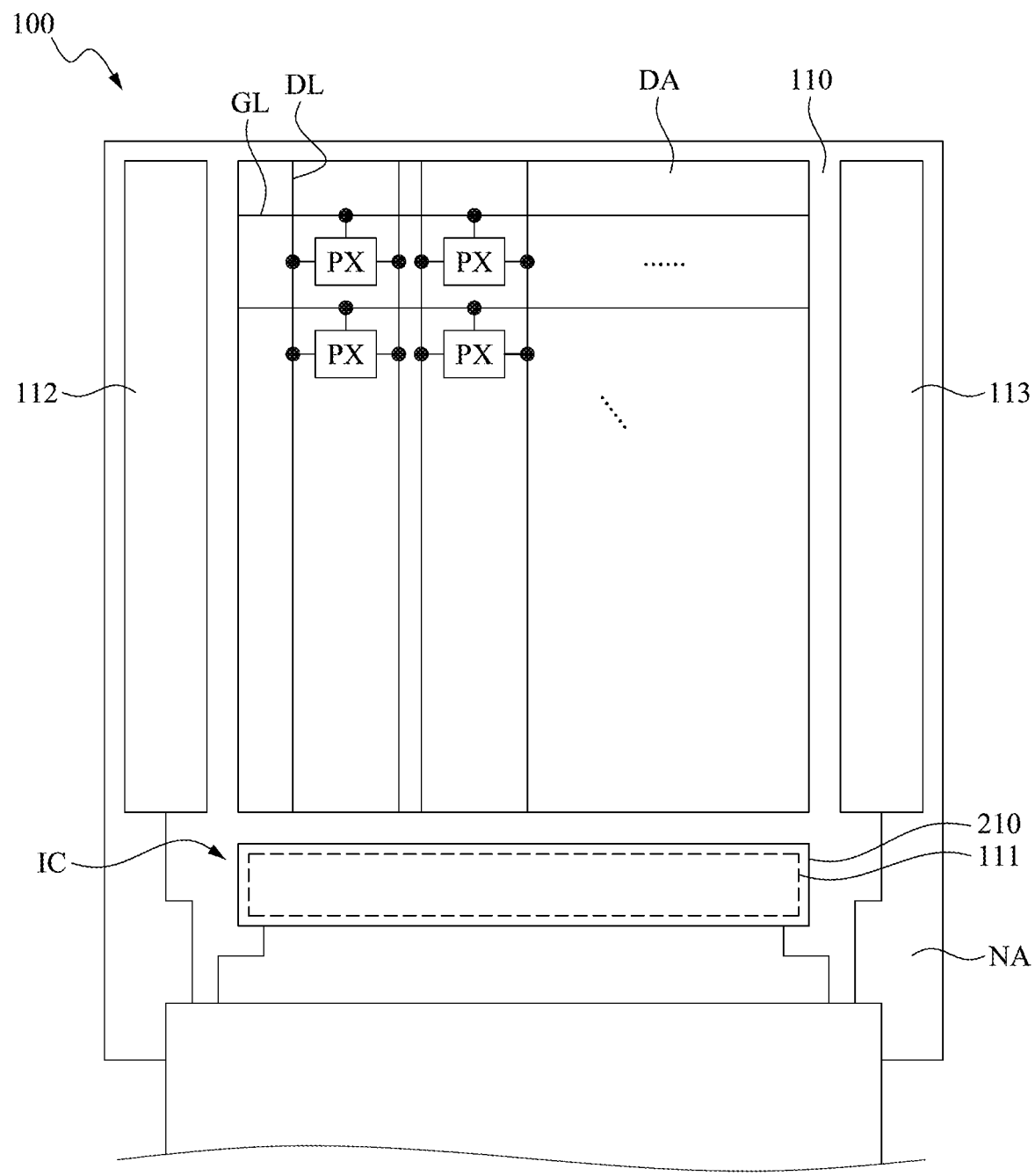
FIG. 1 is a plan view of electronic devices according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Reference is made to FIG. 1. FIG. 1 is a plan view of electronic devices according to some embodiments of the present disclosure. As shown in FIG. 1, one of the electronic devices may be a display panel 100 including a substrate 110 (e.g., an array substrate). The substrate 110 includes a display area DA and a non-display area NA. The display area DA may be a region where an image is displayed. The display area DA may include pixels PX arranged in a matrix. Each of the pixels PX may be provided with a display element displaying an image, and a thin-film transistor (TFT) electrically connected to the display element. The display element may be an organic light-emitting diode (OLED), for example. The pixels PX may be defined by gate lines GL and data lines DL intersecting the gate lines GL. The gate lines GL may extend in a first direction X, and the data lines DL may extend in a second direction Y intersecting the first direction X. The first direction X may correspond to a direction of rows of the pixels PX, and the second direction Y may correspond to a direction of columns of the pixels PX.

The non-display area NA may be a region where no image is displayed, and may surround the display area DA. The non-display area NA may also be a region adjoining, or provided along, the edges of the substrate 110. In the non-display area NA, a bonding portion 111, a gate driving unit 112, and a power supply unit 113 may be provided.

Another of the electronic devices may be a data driving integrated circuit IC. The bonding portion 111 may be a region where the data driving integrated circuit IC, which applies a data signal voltage to the data lines DL, is mounted. The data driving integrated circuit IC may be Chip-on-Glass (COG)-mounted on the bonding portion 111 on the substrate 110. That is, the bonding portion 111 may be a COG bonding unit. Alternatively, in response to the substrate 110 being formed of a flexible material, the bonding portion 111 may be a Chip-on-Plastic (COP) bonding unit.

The gate driving unit 112 may be provided on a side of the substrate 110 perpendicular to the side where the data driving integrated circuit IC is provided. The gate driving unit 112 may provide a gate signal voltage to the gate lines GL, and may sequentially scan the pixels PX. The power supply unit 113 may be provided on side of the substrate 110 opposite to the side where the gate driving unit 112 is provided. The power supply unit 113 may provide a power voltage necessary for driving the pixels PX.

The bonding portion 111 may include a plurality of pads arranged in one direction. The data driving integrated circuit IC may include a substrate 210 and a plurality of bumps B disposed on the substrate 210. The bumps B (referred to FIG. 2) correspond to the pads, respectively, of the bonding portion 111. That is, the bumps B of the data driving integrated circuit IC may be connected one-on-one to the pads of the bonding portion 111. The relationship between the pads of the bonding portion 111 and the bumps B of the data driving integrated circuit IC will hereinafter be described with reference to FIGS. 2 to 5.

Figure 2:
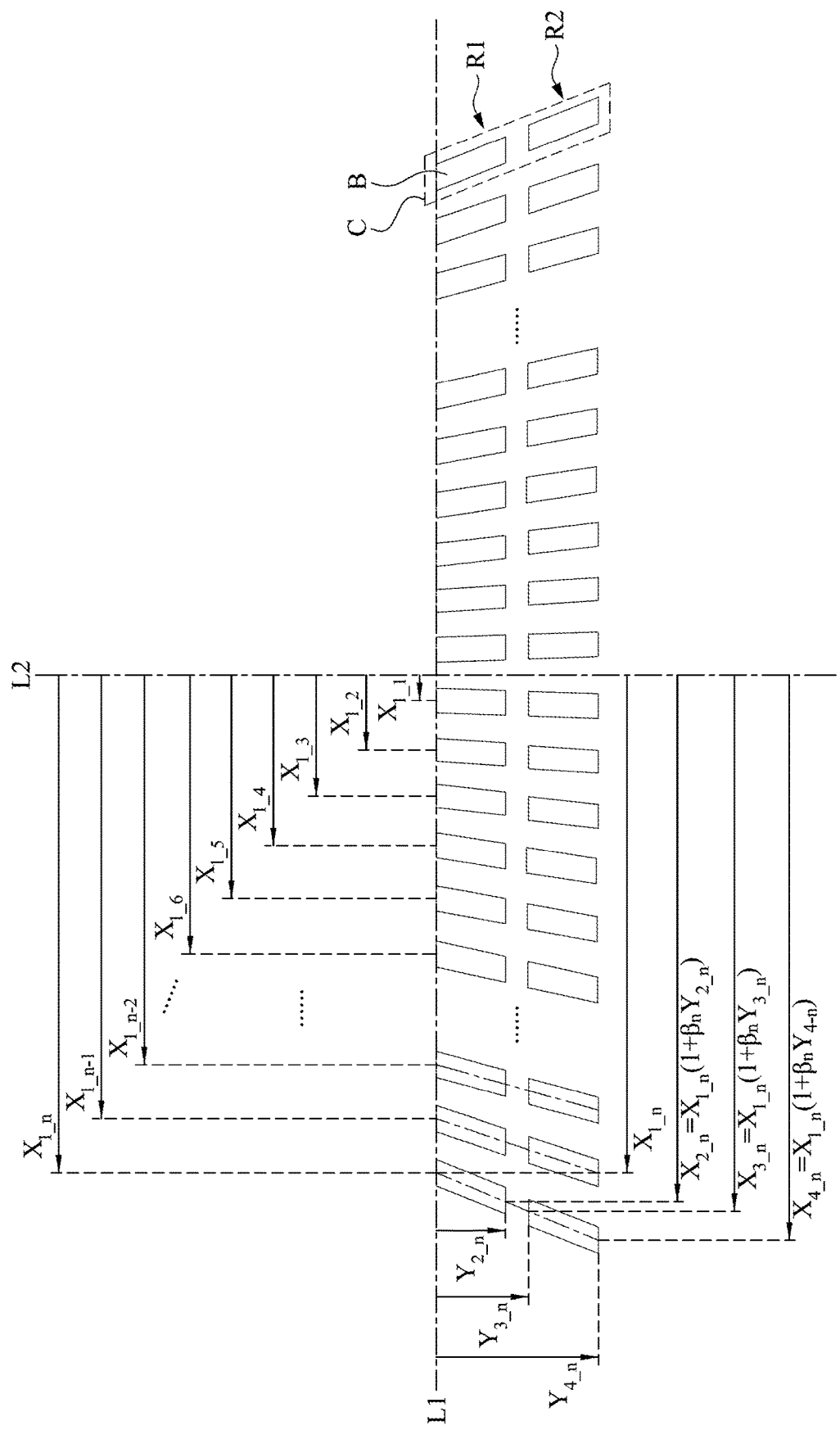
FIG. 2 is a plan view of bumps configuration according to some embodiments of the present disclosure.

Reference is made to FIG. 2. FIG. 2 is a plan view of bumps configuration according to some embodiments of the present disclosure. As shown in FIG. 2, the bumps B are arranged in a first bump row R1 and a second bump row R2. Each of the bumps B has a first end (e.g., the upper end) and a second end (e.g., the lower end) opposite to each other. Centers of the first ends of the bumps B in the first bump row R1 are on a first axial line L1. In some embodiments, for each of the bumps B in the first bump row R1, a first axial coordinate of a center of the second end of a respective one of the bumps B relative to a second axial line L2 perpendicular to the first axial line L1 is $X_A(1+\beta_A Y_A)$, in which $X_A$ is a first axial coordinate of the center of the first end of said respective one of the bumps B relative to the second axial line L2, $Y_A$ is a second axial coordinate of the center of the second end of said respective one of the bumps B relative to the first axial line L1, and $\beta_A$ is a slope coefficient of said respective one of the bumps B.

As shown in FIG. 2, taking the nth bump B in the first bump row R1 arranged from the second axial line L2 as an example, a first axial coordinate of a center of the first end of the nth bump B relative to a second axial line L2 is $X_{1\_n}$. A first axial coordinate of a center of the second end of the nth bump B relative to a second axial line L2 is $X_{2\_n}$. $X_{2\_n}$ is equal to $X_{1\_n}(1+\beta_n Y_{2\_n})$, in which $Y_{2\_n}$ is a second axial coordinate of the center of the second end of the nth bump B relative to the first axial line L1, and $\beta_n$ is a slope coefficient of the nth bump B.

In some embodiments, in the first bump row R1, the slope coefficient of one of the bumps B is identical to the slope coefficient of another of the bumps B. Taking the (n−1)th bump B and the nth bump B in the first bump row R1 arranged from the second axial line L2 as an example, the (n−1)th bump B may has a slope coefficient $\beta_{n-1}$ which is identical to the slope coefficient $\beta_n$ of the nth bump B.

In some embodiments, in the first bump row R1, the slope coefficient of one of the bumps B is different from the slope coefficient of another of the bumps B. For example, the (n−1)th bump B in the first bump row R1 arranged from the second axial line L2 may has a slope coefficient $\beta_{n-1}$ which is different from the slope coefficient $\beta_n$ of the nth bump B in the first bump row R1 arranged from the second axial line L2.

In some embodiments, in the first bump row R1, the slope coefficient of one of the bumps B is smaller than the slope coefficient of another of the bumps B, and said one of the bumps B is closer to the second axial line L2 than said another of the bumps B. Taking the (n−1)th bump B and the nth bump B in the first bump row R1 arranged from the second axial line L2 as an example, the nth bump B is closer to the second axial line L2 than the (n−1)th bump B, and the slope coefficient $\beta_n$ of the nth bump B is smaller than the slope coefficient $\beta_{n-1}$ of the (n−1)th bump B.

In some embodiments, the farther the bumps B in the first bump row R1 are from the second axial line L2, the more the bumps B tilt relative to the second axial line L2.

Furthermore, in some embodiments, the slope coefficients of the bumps B in the first bump row R1 decrease as the bumps B get closer to the second axial line L2. With this bump configuration, the closest bump B (i.e., the first bump B) relative to the second axial line L2 can be avoided from tilting too much.

In some embodiments, the centers of the first ends of the bumps B in the first bump row R1 are arranged equidistantly. In some other embodiments, the centers of the first ends of the bumps B in the first bump row R1 are not arranged equidistantly.

In some embodiments, the bumps B in the first bump row R1 are symmetric relative to the second axial line L2, but the disclosure is not limited in this regard.

As shown in FIG. 2, the bumps B in the second bump row R2 are respectively aligned with the bumps B in the first bump row R1 to respectively form a plurality of bump columns C. A first axial coordinate of a center of the first end of the bump B in the second bump row R2 in a respective one of the bump columns C relative to the second axial line L2 is $X_B(1+\beta_B Y_B)$, in which $X_B$ is a first axial coordinate of the center of the first end of the bump B in the first bump row R1 in said respective one of the bump columns C relative to the second axial line L2, $Y_B$ is a second axial coordinate of the center of the first end of the bump in the second bump row R2 in said respective one of the bump columns C relative to the first axial line L1, and $\beta_B$ is a slope coefficient of the bump in the second bump row R2 in said respective one of the bump columns C.

As shown in FIG. 2, taking the nth bump B in the first bump row R1 and nth bump B in the second bump row R2 (which are in the same bump column C) arranged from the second axial line L2 as an example, a first axial coordinate of a center of the first end of the nth bump B in the second bump row R2 relative to the second axial line L2 is $X_{3\_n}$. $X_{3\_n}$ is equal to $X_{1\_n}(1+\beta_n Y_{3\_n})$, in which $X_{1\_n}$ is the first axial coordinate of the center of the first end of the nth bump B in the first bump row R1 relative to the second axial line L2, is a second axial coordinate of the center of the first end of the nth bump B in the second bump row R2 relative to the first axial line L1, and $\beta_n$ is a slope coefficient of the nth bump B in the first bump row R1. As such, the centers of the first and second ends of the nth bump B in the first bump row R1 and the center of the first end of the nth bump B in the second bump row R2 are arranged in a line.

Furthermore, in some embodiments, a first axial coordinate of a center of the second end of the bump B in said respective one of the bump columns C relative to the second axial line L2 is $X_B(1+\beta_C Y_C)$, in which $Y_C$ is a second axial coordinate of the center of the second end of the bump B in the second bump row R2 in said respective one of the bump columns C relative to the first axial line L1, and $\beta_C$ is a slope coefficient of the bump B in the second bump row R2 in said respective one of the bump columns C.

As shown in FIG. 2, taking the nth bump B in the first bump row R1 and nth bump B in the second bump row R2 arranged from the second axial line L2 as an example, a first axial coordinate of a center of the second end of the nth bump B in the second bump row R2 relative to the second axial line L2 is $X_{4\_n}$ is equal to $X_{1\_n}(1+\beta_n Y_{4\_n})$, in which is a second axial coordinate of the center of the second end of the nth bump B in the second bump row R2 relative to the first axial line L1. As such, the centers of the first and second ends of the nth bump B in the first bump row R1 and the centers of the first and second ends of the nth bump B in the second bump row R2 are arranged in a line.

In some other embodiments, the slope coefficients of the bumps B in said respective one of the bump columns are different. For example, the nth bump B in the first bump row R1 arranged from the second axial line L2 may has a slope coefficient $\beta_{n\_1}$, and nth bump B in the second bump row R2 arranged from the second axial line L2 may has a slope coefficient $\beta_{n\_2}$ different from the slope coefficient $\beta_{n\_1}$.

Figure 3:
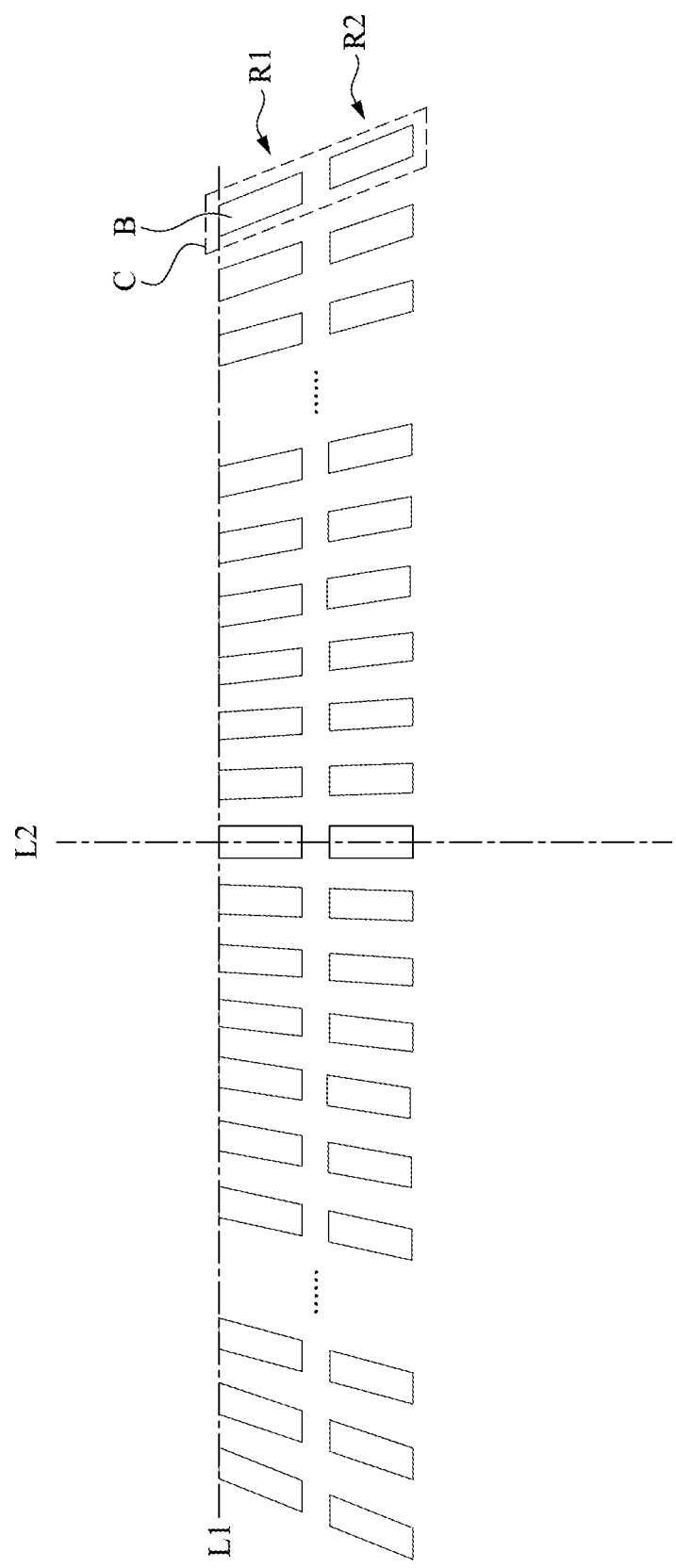
FIG. 3 is a plan view of bumps configuration according to some embodiments of the present disclosure.

In some embodiments, as shown in FIG. 2, the second axial line L2 is centered at adjacent two of the bumps B in the first bump row R1 and adjacent two of the bumps B in the first bump row R1, but the disclosure is not limited in this regard. Reference is made to FIG. 3. FIG. 3 is a plan view of bumps configuration according to some embodiments of the present disclosure. As shown in FIG. 3, the second axial line L2 passes through the first end and the second end of one of the bumps B in the first bump row R1 and the first end and the second end of one of the bumps B in the second bump row R2.

Figure 4:
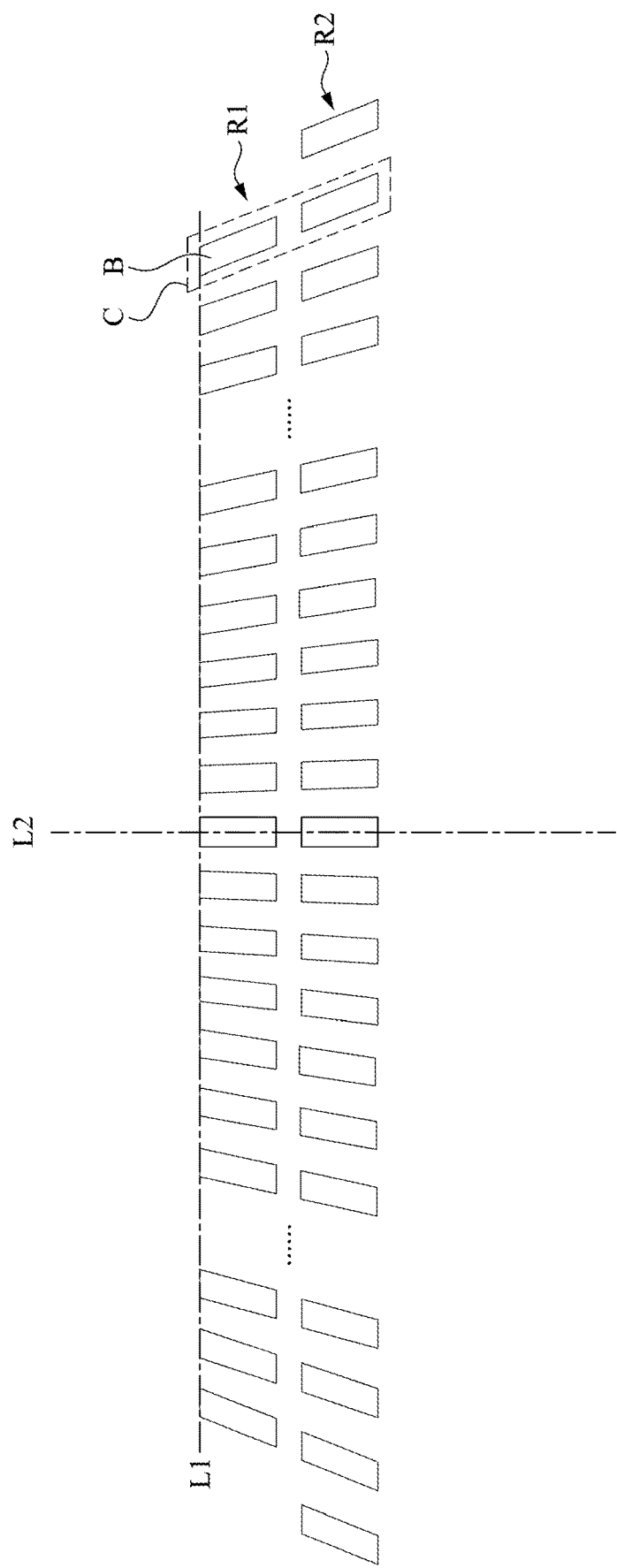
FIG. 4 is a plan view of bumps configuration according to some embodiments of the present disclosure.

In some embodiments, as shown in FIG. 2, a number of the bumps B in the first bump row R1 and a number of the bumps B in the second bump row R2 are the same, but the disclosure is not limited in this regard. Reference is made to FIG. 4. FIG. 4 is a plan view of bumps configuration according to some embodiments of the present disclosure. As shown in FIG. 4, a number of the bumps B in the first bump row R1 and a number of the bumps B in the second bump row R2 are different. Specifically, two of the bumps B other than the bump columns C in the second bump row R2 are arranged at opposite ends of the second bump row R2.

Figure 5:
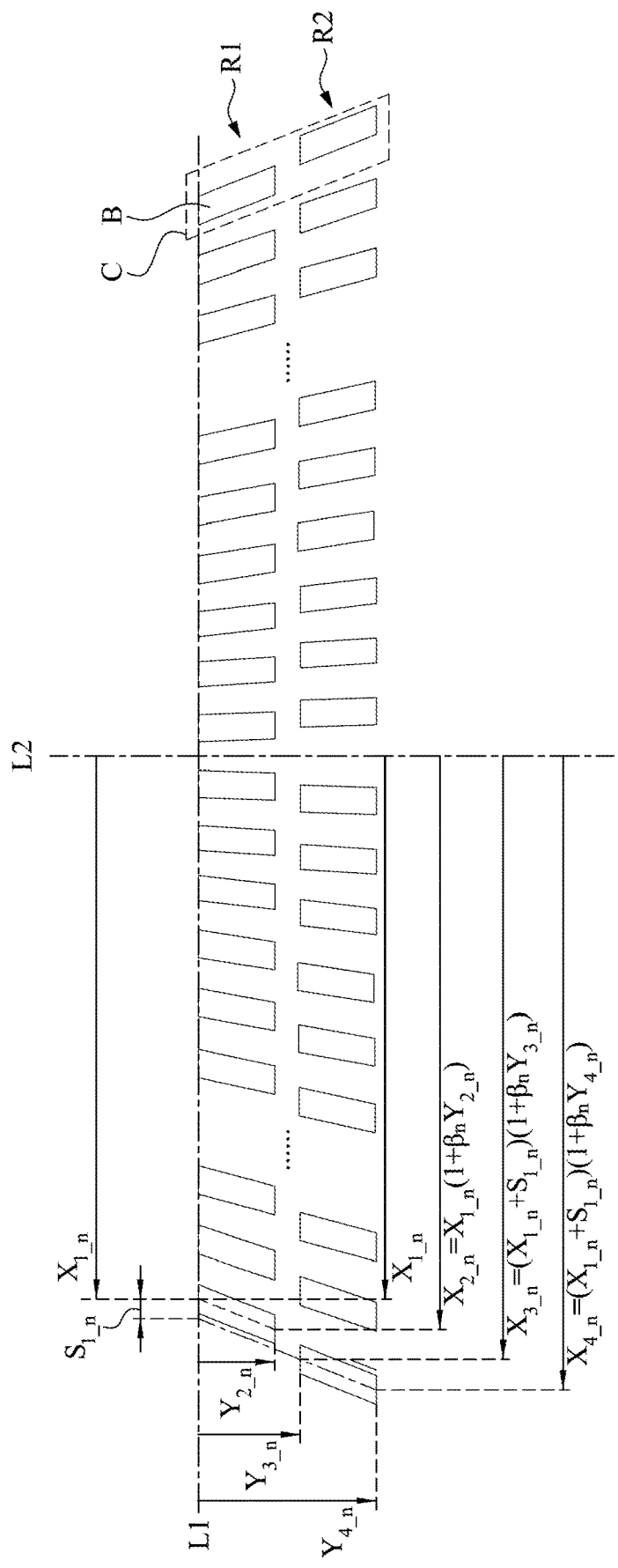
FIG. 5 is a plan view of bumps configuration according to some embodiments of the present disclosure.

Reference is made to FIG. 5. FIG. 5 is a plan view of bumps configuration according to some embodiments of the present disclosure. As shown in FIG. 5, the bumps B in the first bump row R1 are identical to those shown in FIG. 2. A first axial coordinate of a center of the first end of the bump B in the second bump row R2 in said respective one of the bump columns C relative to the second axial line is $(X_B+S)(1+\beta_B Y_B)$, in which $X_B$ is a first axial coordinate of the center of the first end of the bump B in the first bump row R1 in said respective one of the bump columns C relative to the second axial line L2, $Y_B$ is a second axial coordinate of the center of the first end of the bump B in the second bump row R2 in said respective one of the bump columns C relative to the first axial line L1, and $\beta_B$ and S are respectively a slope coefficient and a shift value of the bump B in the second bump row R2 in said respective one of the bump columns C.

As shown in FIG. 5, taking the nth bump B in the first bump row R1 and nth bump B in the second bump row R2 arranged from the second axial line L2 as an example, a first axial coordinate of a center of the first end of the nth bump B in the second bump row R2 relative to the second axial line L2 is $X_{3\_n}$. $X_{3\_n}$ is equal to $(X_{1\_n}+S_{1\_n})(1+\beta_n Y_{3\_n})$, in which $X_{1\_n}$ is the first axial coordinate of the center of the first end of the nth bump B in the first bump row R1 relative to the second axial line L2, $Y_{3\_n}$ is a second axial coordinate of the center of the first end of the nth bump B in the second bump row R2 relative to the first axial line L1, $\beta_n$ is a slope coefficient of the nth bump B in the first bump row R1, and $S_{1\_n}$ is a shift value of the nth bump B in the second bump row R2.

Furthermore, in some embodiments, a first axial coordinate of a center of the second end of the bump B in said respective one of the bump columns C relative to the second axial line L2 is $(X_B+S)(1+\beta_C Y_C)$, in which $Y_C$ is a second axial coordinate of the center of the second end of the bump B in the second bump row R2 in said respective one of the bump columns C relative to the first axial line L1, and $\beta_C$ is a slope coefficient of the bump B in the second bump row R2 in said respective one of the bump columns C.

As shown in FIG. 5, taking the nth bump B in the first bump row R1 and nth bump B in the second bump row R2 arranged from the second axial line L2 as an example, a first axial coordinate of a center of the second end of the nth bump B in the second bump row R2 relative to the second axial line L2 is $X_{4\_n}$. $X_{4\_n}$ is equal to $(X_{1\_n}+S_{1\_n})(1+\beta_n Y_{4\_n})$, in which is a second axial coordinate of the center of the second end of the nth bump B in the second bump row R2 relative to the first axial line L1.

In some embodiments, the shift value of the bump B in the second bump row R2 in one of the bump columns C is identical to the shift value of the bump B in the second bump row R2 in another of the bump columns C, and the bump configuration may be illustrated by FIG. 5.

In some embodiments, the slope coefficients of the bump B in the first bump row R1 and the bump B in the second bump row R2 in said respective one of the bump columns C are the same. For example, as shown in FIG. 5, the nth bump B in the first bump row R1 and nth bump B in the second bump row R2 arranged from the second axial line L2 both have the same slope coefficient $\beta_n$, but the disclosure is not limited in this regard.

Figure 6:
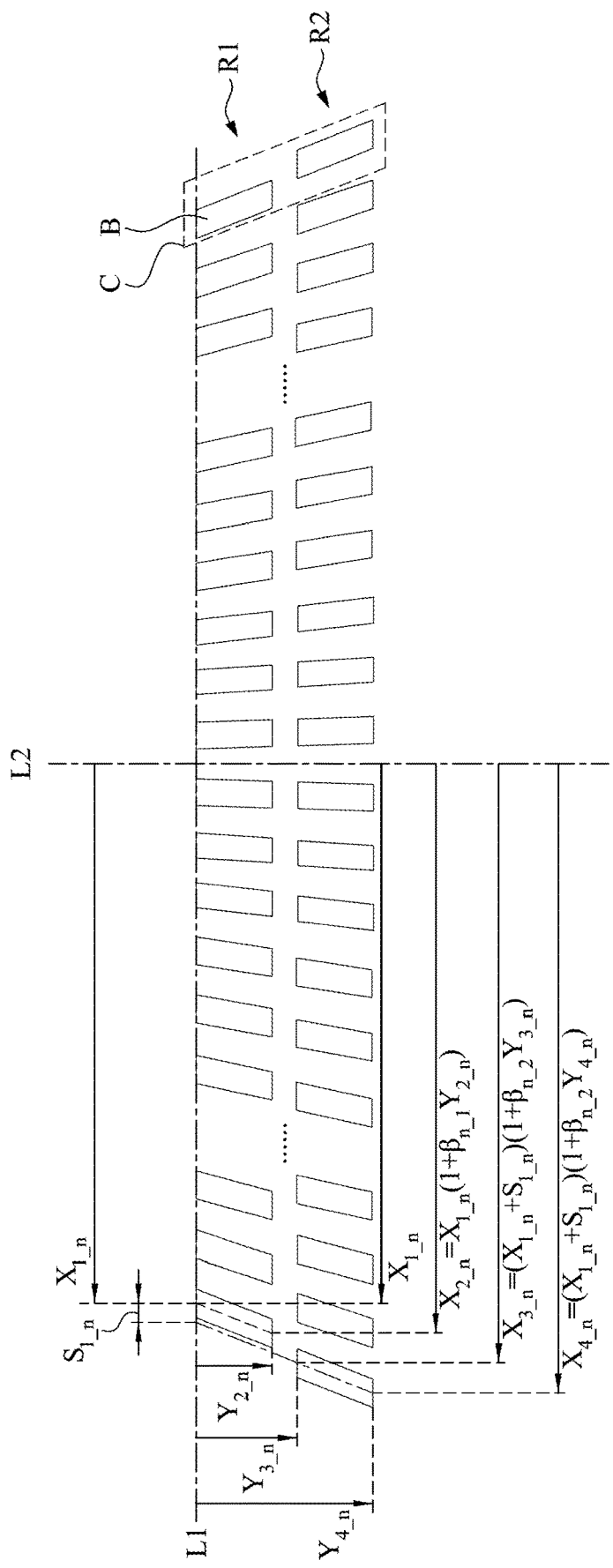
FIG. 6 is a plan view of bumps configuration according to some embodiments of the present disclosure.

In some embodiments, the slope coefficients of the bump B in the first bump row R1 and the bump B in the second bump row R2 in said respective one of the bump columns C are different. Reference is made to FIG. 6. FIG. 6 is a plan view of bumps configuration according to some embodiments of the present disclosure. As illustrated in FIG. 6, a first axial coordinate of the center of the first end of the nth bump B in the first bump row R1 relative to the second axial line L2 is $X_{1\_n}$. A first axial coordinate of a center of the second end of the nth bump B relative to a second axial line L2 is $X_{2\_n}$. $X_{2\_n}$ is equal to $X_{1\_n}(1+\beta_{n\_1} Y_{2\_n})$, in which $Y_{2\_n}$ is a second axial coordinate of the center of the second end of the nth bump B relative to the first axial line L1, and $\beta_{n\_1}$ is a slope coefficient of the nth bump B in the first bump row R1. A first axial coordinate of a center of the first end of the nth bump B in the second bump row R2 relative to the second axial line L2 is $X_{3\_n}$. $X_{3\_n}$ is equal to $(X_{1\_n}+S_{1\_n})(1+\beta_{n\_2} Y_{3\_n})$, in which $Y_{3\_n}$ is a second axial coordinate of the center of the first end of the nth bump B in the second bump row R2 relative to the first axial line L1, $\beta_{n\_2}$ is a slope coefficient of the nth bump B in the second bump row R1, and $S_{1\_n}$ is a shift value of the nth bump B in the second bump row R2. A first axial coordinate of a center of the second end of the nth bump B in the second bump row R2 relative to the second axial line L2 is $X_{4\_n}$. $X_{4\_n}$ is equal to $(X_{1\_n}+S_{1\_n})(1+\beta_{n\_2} Y_{4\_n})$, in which $Y_{4\_n}$ is a second axial coordinate of the center of the second end of the nth bump B in the second bump row R2 relative to the first axial line L1. It can be seen that the slope coefficient $\beta_{n\_1}$ of the bump B in the first bump row R1 is different from the slope coefficient $\beta_{n\_2}$ of the bump B in the second bump row R2.

In some embodiments, the shift value of the bump B in the second bump row R2 in one of the bump columns C is different from the shift value of the bump B in the second bump row R2 in another of the bump columns C, and the bump configuration may be illustrated by FIG. 6.

In some embodiments, any of the bump configurations described above may further include one or more additional bump rows other than the first bump row R1 and the second bump row R2, and the bumps B in said one or more additional bump rows may be flexibly arranged below the second bump row R2 according to any of arrangement rules of described in the above embodiments.

In some embodiments, the bonding portion 111 and the data driving integrated circuit IC include pads or bumps B that may be formed with the same bump configuration, and the bonding portion 111 and the data driving integrated circuit IC may flexibly respond to the deformation of the substrate 110 of the display panel 100. In some embodiments, the bumps B of the data driving integrated circuit IC may be coupled to the pads of the bonding portion 111 via an anisotropic conductive film (ACF), and thus, may be able to exchange electrical signals with each other. In response to the substrate 110 expanding, the bumps B of the data driving integrated circuit IC may be aligned with the pads of the bonding portion 111, which is deformed as a result of the expansion of the substrate 110, by moving the data driving integrated circuit IC downward along the direction Y (to which the second axial line is aligned to be parallel) by a distance. As a result, the data driving integrated circuit IC may be aligned with the bonding portion 111, and may be properly mounted on the substrate 110. On the other hand, in response to the substrate 110 contracting, the bumps B of the data driving integrated circuit IC may be aligned with the pads of the bonding portion 111, which are deformed as a result of the contraction of the substrate 110, by moving the data driving integrated circuit IC upward along the direction Y by the distance. As a result, the data driving integrated circuit IC may be aligned with the bonding portion 111, and may be properly mounted on the substrate 110.

To facilitate connecting the pads of the bonding portion 111 and the bumps B of the data driving integrated circuit IC, the pads of the bonding portion 111 may be formed to have longer short sides and longer long sides than the bumps B of the data driving integrated circuit IC. That is, the size of the pads of the bonding portion 111 may be larger than the size of the bumps B of the data driving integrated circuit IC. The pads of the bonding portion 111 may be formed to have longer sides than the bumps B of the data driving integrated circuit IC to ensure the movement of the data driving integrated circuit IC in the direction Y.

According to the foregoing recitations of the embodiments of the disclosure, it can be seen that in the electronic device of the present disclosure, the degrees of tilt of the bumps are varied based on the first ends of the bumps relative to a reference line (i.e., the second axial line). As such, when a mismatch occurs between the bumps of two electronic devices to be bonded, the bumps may flexibly respond to the deformation of the substrate of one of the electronic devices. Specifically, in response to the substrate expanding, the bumps of another of the electronic devices may be aligned with the bumps on the deformed substrate as a result of expansion by moving said another of the electronic devices along the reference line by a distance. As a result, bonding reliability may be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electronic device, comprising:
    a substrate; and
    a plurality of first bumps disposed on the substrate and arranged in a first bump row, each of the plurality of first bumps having a first end and a second end opposite to each other, centers of the first ends of the plurality of first bumps being on a first axial line, wherein the centers of the first ends of the plurality of first bumps are not arranged equidistantly;
    wherein for each of the plurality of first bumps, a first axial coordinate of a center of the second end of a respective one of the plurality of first bumps relative to a second axial line perpendicular to the first axial line is $X_A(1+\beta_A Y_A)$, wherein $X_A$ is a first axial coordinate of the center of the first end of said respective one of the plurality of first bumps relative to the second axial line, $Y_A$ is a second axial coordinate of the center of the second end of said respective one of the plurality of first bumps relative to the first axial line, and $\beta_A$ is a slope coefficient of said respective one of the plurality of first bumps.

2. The electronic device of claim 1, wherein the slope coefficient of one of the plurality of first bumps is identical to the slope coefficient of another of the plurality of first bumps.

3. The electronic device of claim 1, wherein the slope coefficient of one of the plurality of first bumps is different from the slope coefficient of another of the plurality of first bumps.

4. The electronic device of claim 3, wherein the slope coefficient of said one of the plurality of first bumps is smaller than the slope coefficient of said another of the plurality of first bumps, and said one of the plurality of first bumps is closer to the second axial line than said another of the plurality of first bumps.

5. The electronic device of claim 3, wherein the slope coefficients decrease as the plurality of first bumps get closer to the second axial line.

6. The electronic device of claim 1, wherein the farther the plurality of first bumps are from the second axial line, the more the plurality of first bumps tilt relative to the second axial line.

7. The electronic device of claim 1, wherein the second axial line is centered at adjacent two of the plurality of first bumps.

8. The electronic device of claim 1, wherein the second axial line passes through the first end and the second end of one of the plurality of first bumps.

9. The electronic device of claim 1, wherein the plurality of first bumps are symmetric relative to the second axial line.

10. The electronic device of claim 1, further comprising a plurality of second bumps disposed on the substrate and arranged in a second bump row, at least a part of the plurality of second bumps being respectively aligned with the plurality of first bumps to respectively form a plurality of bump columns.

11. The electronic device of claim 10, wherein each of the plurality of second bumps has a first end and a second end opposite to each other,
    wherein a first axial coordinate of a center of the first end of one of the plurality of second bumps relative to the second axial line is $X_B(1+\beta_B Y_B)$, wherein $X_B$ is a first axial coordinate of the center of the first end of one of the plurality of first bumps in a respective one of the plurality of bump columns relative to the second axial line, $Y_B$ is a second axial coordinate of the center of the first end of the one of the plurality of second bumps relative to the first axial line, and $\beta_B$ is a slope coefficient of the one of the plurality of first bumps in said respective one of the plurality of bump columns.

12. The electronic device of claim 11, wherein a first axial coordinate of a center of the second end of the one of the plurality of second bumps relative to the second axial line is $X_B(1+\beta_C Y_C)$, wherein $Y_C$ is a second axial coordinate of the center of the second end of the one of the plurality of second bumps relative to the first axial line, and $\beta_C$ is a slope coefficient of the one of the plurality of second bumps.

13. The electronic device of claim 12, wherein the slope coefficients of the one of the plurality of first bumps and the one of the plurality of second bumps.

14. The electronic device of claim 12, wherein the slope coefficients of the one of the plurality of first bumps and the one of the plurality of second bumps.

15. The electronic device of claim 10, wherein each of the second bumps has a first end and a second end opposite to each other,
   wherein a first axial coordinate of a center of the first end of one of the plurality of second bumps relative to the second axial line is $(X_B+S)(1+\beta_B Y_B)$, wherein $X_B$ is a first axial coordinate of the center of the first end of one of the plurality of first bumps in a respective one of the plurality of bump columns relative to the second axial line, $Y_B$ is a second axial coordinate of the center of the first end of the one of the plurality of second bumps relative to the first axial line, and $\beta_B$ and S are respectively a slope coefficient and a shift value of the one of the plurality of second bumps.

16. The electronic device of claim 15, wherein the shift value of one of the plurality of second bumps in one of the plurality of bump columns is different from the shift value of another of the plurality of second bumps in another of the plurality of bump columns.

17. The electronic device of claim 10, wherein a number of the plurality of first bumps and a number of the plurality of second bumps are different.

18. The electronic device of claim 17, wherein two of the plurality of second bumps other than the plurality of bump columns are arranged at opposite ends of the second bump row.

19. The electronic device of claim 10, wherein the plurality of second bumps are symmetric relative to the second axial line.

\* \* \* \* \*